United States Patent [19]

Dennis

[11] Patent Number: 4,782,589
[45] Date of Patent: Nov. 8, 1988

[54] PROCESS OF CONNECTING LEAD FRAME TO A SEMI-CONDUCTOR DEVICE AND A DEVICE TO EFFECT SAME

[76] Inventor: Richard K. Dennis, R.D. #2, Box 2039, Paddletown Rd., Etters, Pa. 17319

[21] Appl. No.: 34,663

[22] Filed: Apr. 6, 1987

[51] Int. Cl.⁴ ............................................. H01R 43/02
[52] U.S. Cl. .................................... 29/827; 29/564.6; 29/759; 29/741; 29/843; 357/70; 361/421
[58] Field of Search .................... 29/827, 564.1, 564.6, 29/747, 843, 759, 761, 741; 174/52 FP; 357/69, 70; 361/421

[56] References Cited

U.S. PATENT DOCUMENTS

| | | | |
|---|---|---|---|
| 3,838,984 | 10/1974 | Crane et al. | 174/52 PE |
| 4,109,096 | 8/1978 | Dehaine | 174/68.5 |
| 4,196,959 | 4/1980 | Chesemore et al. | 29/884 |
| 4,234,666 | 11/1980 | Gursky | 174/52 FP |
| 4,323,293 | 4/1982 | DeRowen et al. | 29/827 |
| 4,496,965 | 1/1985 | Orcutt et al. | 357/70 |

Primary Examiner—P. W. Echols
Attorney, Agent, or Firm—C. Hercus Just

[57] ABSTRACT

A lead frame having opposite rows of leads to be connected to the edges of a semi-conductor device and heads on one end of the leads provided with similar angularly related legs between which the edges of the device are received for ultimate soldered connection thereto, the leads and corresponding heads respectively extending from opposite sides of an elongated supporting strip connected at the ends thereof to the lead frame adjacent recesses in the frame to permit bending of the rows of leads substantially along the axis of the supporting strip and thereby extend the heads of the leads upwardly to cause the uppermost legs of the heads of opposite rows thereof to be spaced apart a distance greater than the width of the device to be connected thereto while the ends of the rows of lowermost legs of the heads are spaced a distance less than the width of the device to be supported thereon prior to the rows of leads being reversely bent to restore the bent leads and heads thereon to the plane of the frame and thereby cause the opposite rows of uppermost legs to be extended toward each other adequately to overlie the edges of the device and in conjunction with the lowermost legs of the heads secure the device between the rows of heads. The invention also includes a process for accomplishing the foregoing results and a forming device to achieve the same.

14 Claims, 5 Drawing Sheets

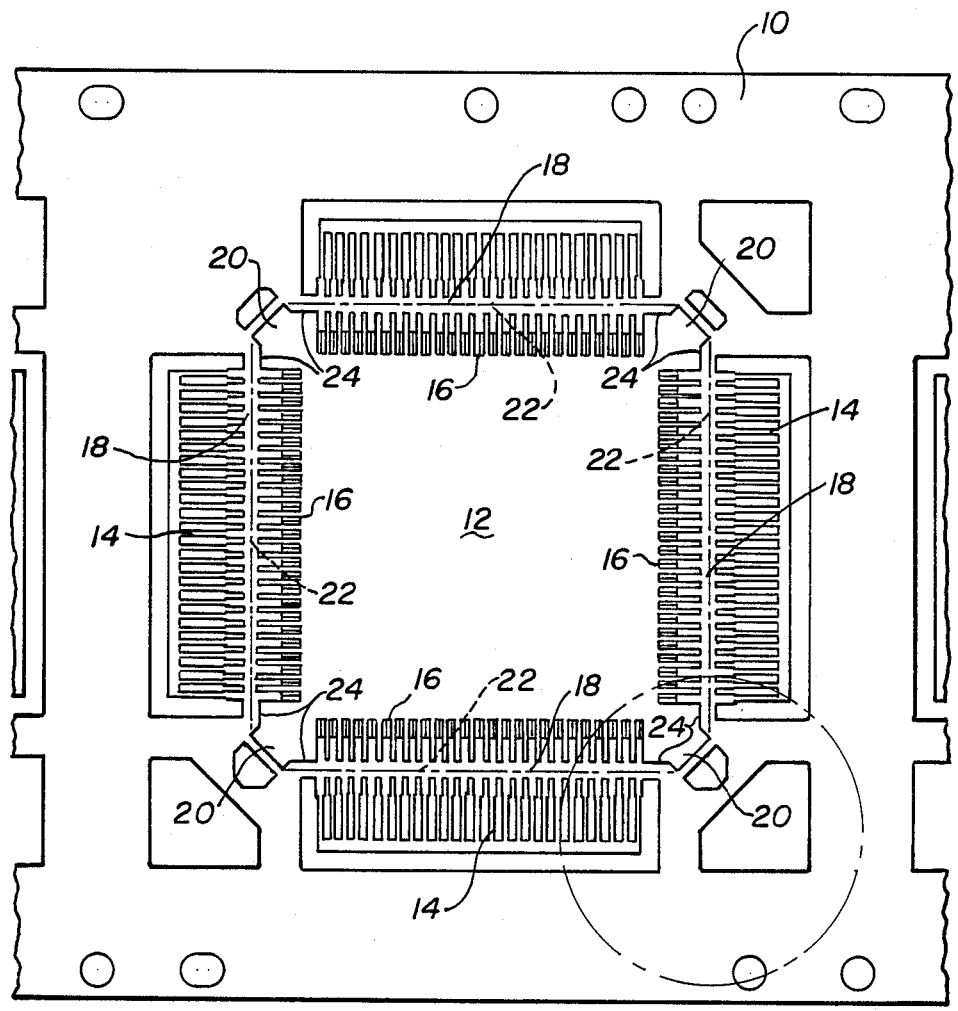
Fig. 1
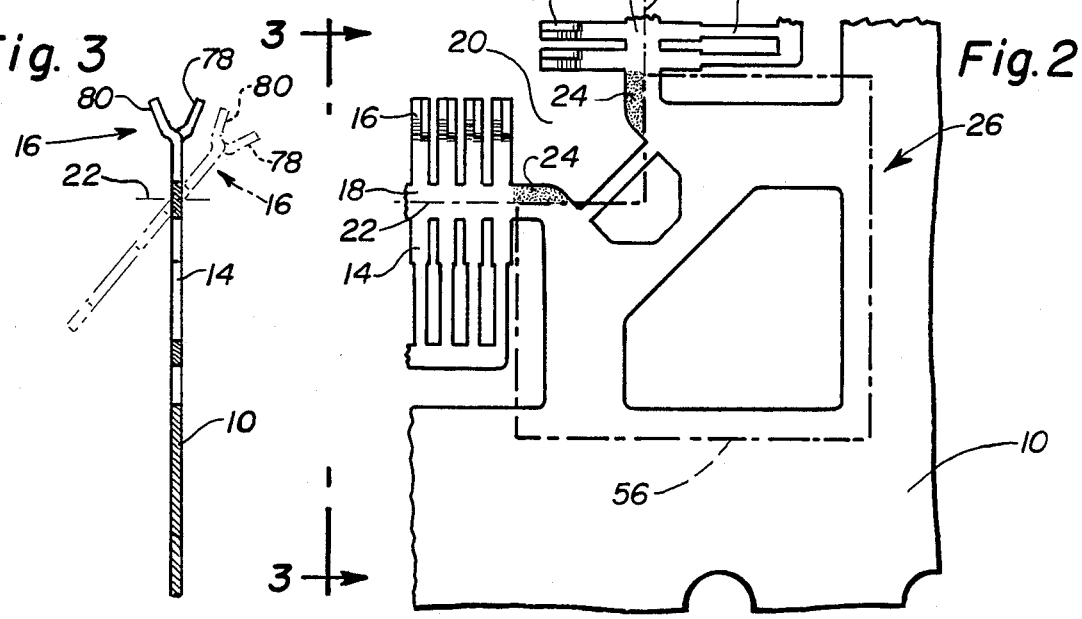
Fig. 3
Fig. 2

PROCESS OF CONNECTING LEAD FRAME TO A SEMI-CONDUCTOR DEVICE AND A DEVICE TO EFFECT SAME

BACKGROUND OF THE INVENTION

This invention relates to a lead frame having rows of leads thereon upon one end of which slit heads are mounted in opposing rows, or in a pair of transversely disposed pairs of rows, between which a space is provided for the reception of a semiconductor device which comprises a suitable substrate upon which electronic circuits are imprinted either upon one or both faces thereof and to which leads are to be connected. When the semiconductor devices are positioned between the heads on said rows of leads, soldering of the heads to the ends of the circuits on the substrate is effected.

Various problems have been encountered incident to the positioning of semi-conductor devices between opposite rows of leads and heads thereon and various attempts to solve said problems comprise the subject matter of the following patents:

U.S. Pat. No. 3,838,984—Crame et al, Oct. 1, 1974
U.S. Pat. No. 4,109,096—Dehaine, Aug. 22, 1978
U.S. Pat. No. 4,196,959—Chesemore et al, Apr. 8, 1980
U.S. Pat. No. 4,234,666—Gursky, Nov. 18, 1980
U.S. Pat. No. 4,323,293—DeRouen et al, Apr. 6, 1982
U.S. Pat. No. 4,496,965—Orcutt et al, Jan. 29, 1985

The present invention also is somewhat of a counterpart of applicant's prior pending application, Ser. No. 648,972, filed Sept. 10, 1984, now abandoned, and copending C.I.P. application Ser. No. 10,297, filed Feb. 2, 1987, and offers certain improvements thereover without depreciating the subject matter of said prior applications, details of which are set forth below:

It is customary in furnishing lead frames to the industry requiring the same to arrange the same in strip form of indefinite length. The strips are formed from relatively thin sheet metal, one common form now employed being copper of a certain thickness and flexibility. In stamping thin metal strips of this type, such as to slit the heads on the end of leads and bend the legs of the heads apart, for example, to achieve a certain spacing between such legs, it is necessary to bend the legs apart a slightly greater distance than is desired in order that the springiness of the material will tend to return the legs at least slightly toward the original position thereof and features of this type have to be taken into consideration incident to designing final products.

SUMMARY OF THE INVENTION

It is among the principal objects of the present invention to stamp strips of thin metal of the type of metal conventionally used, such as certain types of copper, to provide rows of closely spaced leads upon one end of which a head is formed and said rows of leads are provided either in spaced opposite relationship within a so-called frame of the metal, and in many instances, two pairs of opposed rows of said connected leads and heads are provided in the frame in such manner that a substantially square space is formed between the outer ends of the heads of all of the rows thereof to receive therebetween a semi-conductor device which ultimately is to be connected to all of the rows of heads and subsequently soldered thereto.

Initially, the ends of the legs of the heads which are in opposition to each other are spaced apart a distance sufficiently less than the transverse dimension of the semi-conductor device to be supported therebetween so as to secure the device between said rows of heads and the object of the present invention is to arrange the legs of each head in angular disposition to each other in the form of a Y and at least the portions of the legs which directly engage the device are straight. Parallel rows of the leads and corresponding heads which are longitudinally arranged therewith are supported by a transverse supporting strip of the same metal and thereby integrally connects the rows of leads together. The opposite ends of said supporting strip respectively are connected to certain portions of the main lead frame, adjacent spaces respectively extending outwardly into the frame, whereby it now has been found that by firmly clamping portions of the lead frame adjacent the outer ends of the supporting strip and/or portions of said ends of the supporting strip between flat surfaces of a forming and supporting device, the opposite rows of the headed leads can be disposed at an angle which is no greater than 40° to the plane of the lead frame, along the axis of the supporting strip, or closely parallel to it, so as to extend the heads out of the plane of the lead frame uniformly at such angle to the plane of the lead frame.

Such bending of the portions of the lead frame and/or the supporting strip elevates the heads sufficiently above the plane of the lead frame that the upper legs of each head in opposing rows thereof are spaced apart a distance sufficiently greater than the transverse dimension of a semi-conductor device to be supported between said heads, while the lower legs of each of the opposed rows of heads are spaced apart a distance less than the transverse dimension of such device, and thus, form a support therefor.

Accordingly, thereafter, when the leads and heads of opposite rows thereof are restored to the plane of the main lead frame, by reversely bending the portions of the lead frame and/or supporting strip, the outer ends of the upper legs of the heads are extended toward each other a sufficient distance that they overlie the edges of the device in a manner that they may be connected to terminals of printed circuits upon said device, usually by employing solder. The lower legs of the rows of heads are always spaced apart a distance less than the transverse dimension of the semi-conductor device in both aforementioned positions thereof.

Another object of the invention is to provide the lead frame adjacent opposite ends of the supporting strips with outwardly extending cutouts or notches which intersect the axis of each of said supporting strips relative to the frame thereby to form adjacent said ends of the strips hinge portions of said frame which may be bent to extend the heads of the leads sufficiently above the plane of the lead frame for the purposes set forth above, while other portions of the lead frame adjacent said cutouts or notches are firmly clamped between opposing flat surfaces of the forming device.

Still another object of the invention is to dispose the rows of headed leads and/or portions of said supporting strip at a desired angle to the plane of the lead frame, as stated above, and correspondingly raise the bent ends and heads connected thereto at an exemplary maximum angle of approximately 40° to said plane of the main frame and in so doing, the heads are elevated above the original plane in which they were disposed and results in moving the outermost edges of the upper legs of the rows of heads laterally an exemplary distance of approximately 0.034 inches, which has been found highly adequate to enable one form of the desired semi-conductor devices to be disposed between the upper legs and upon the plane of the lower legs of said rows of heads, while in a vertical direction, the heads also are disposed above the original position thereof relative to the axis of bends of the designated portions of the lead frame and/or supporting strips which support the headed leads.

Another object of the invention is to provide a method by which the opposite rows of the headed leads of a lead frame unit are first disposed at uniform angles to the plane of the unit to space apart the upper legs of each head in opposite rows thereby sufficiently to pass therebetween a geometric semiconductor device and position it upon the opposite rows of the lower legs of each head which are always spaced a distance less than the transverse dimension of such device, and then return the headed leads to the plane of the lead frame unit which causes the upper legs of said heads to overlie the edges of the device and thereby secure the device against removal from said leads, following which said overlying legs are depressed toward the substrate.

Still another object of the invention is to provide a forming mechanism comprising a plurality of stations respectively including power-operated means, one of said stations having means to receive a strip of said lead frame units stepwise and successively dispose the leads of the frames at uniform angles to cause the heads to be above the plane of said frames and the upper legs of opposite rows of said leads to be spaced apart a distance greater than the transverse dimension of the device to be positioned upon the opposite rows of lower legs of said head, and a second station having means to restore the leads to the plane of the lead frames and thereby cause the upper legs of said heads to overlie the edges of the device positioned between said opposite rows of heads.

BRIEF DESCRIPTION OF THE DRAWINGS

FIG. 1 is an enlarged plan view of an exemplary lead frame embodying the principles of the invention and comprising one frame of a series thereof connected longitudinally in infinite length.

FIG. 2 is a fragmentary enlarged section of the lead frame shown in FIG. 1 as contained in the exemplary broken circle of FIG. 1 and, in stippled illustration, shows bendable hinge portions of the lead frame which are engaged to be bent and thereby dispose the rows of leads at an angle to the plane of the overall lead frame.

FIG. 3 is a further enlarged side elevation of an individual lead, such as shown in FIGS. 1 and 2, as seen on the line 3—3 of FIG. 2, the lead being illustrated in full lines in flat condition, and in phantom, in an angular position, resulting from bending of the hinge portions of the frame shown in FIG. 2.

DETAILED DESCRIPTION OF THE PREFERRED EMBODIMENTS OF THE INVENTION

Figure 4:
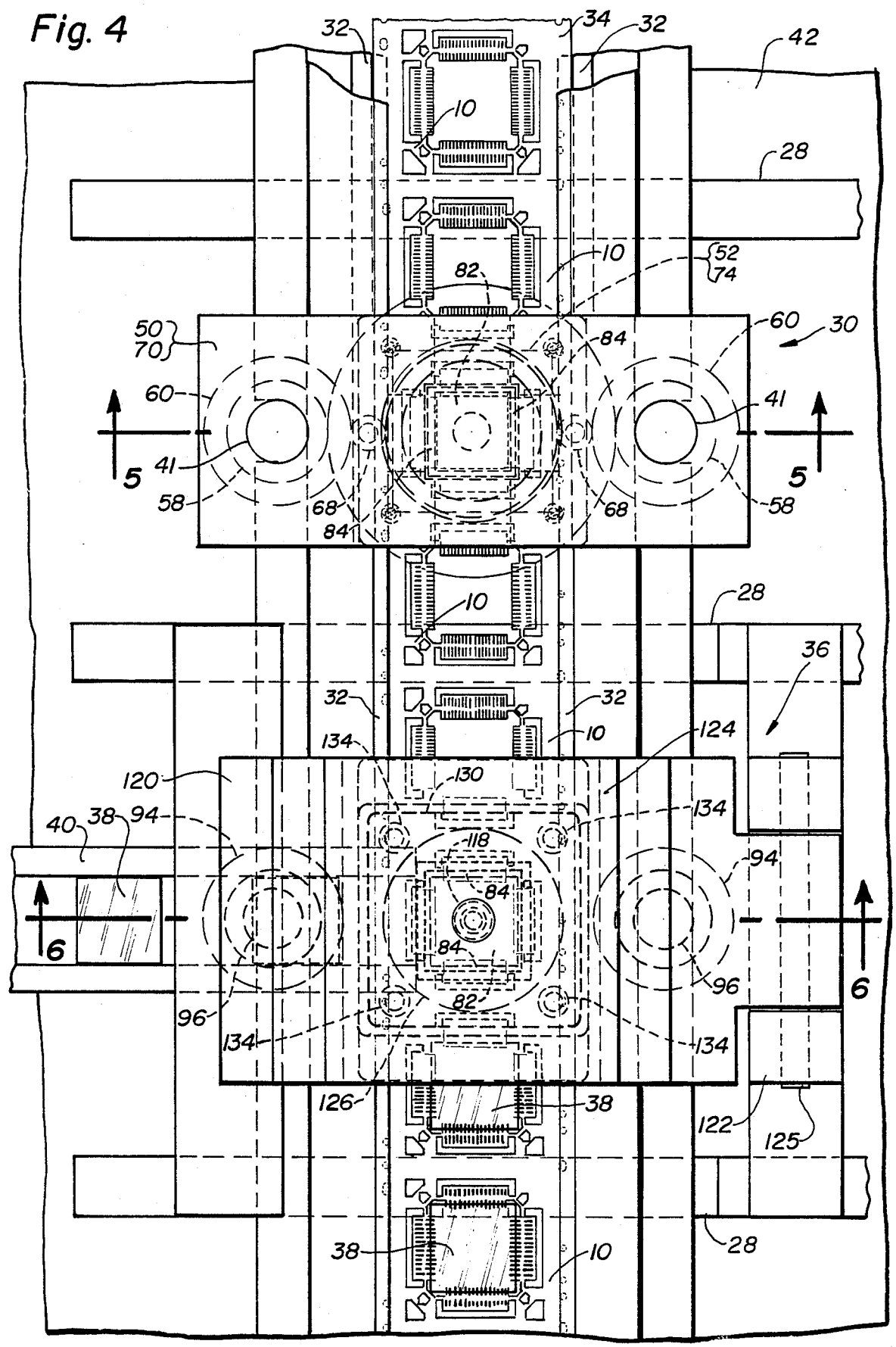
FIG. 4 is a plan view of forming mechanism embodying the principles of the invention and showing a first station at which the rows of leads are bent at an angle to the plane of the lead frame, a second station where semi-conductor devices are delivered to the machine and installed sequentially and respectively in the central openings of the lead frame, the figure also illustrating the fragmentary section of a strip of lead frames which move stepwise through said stations.

The subject matter of the present application is in some respects an improvement over certain aspects of the subject matter of applicant's co-pending application Ser. No. 10,297, filed Feb. 2, 1987. In said co-pending application, the lead frames include connecting strips which are twisted at the ends to dispose the leads and especially the headed ends thereof at an angle to the plane of the frames in order to dispose the heads in position to receive a semi-conductor device and connect the same to said heads. The mechanism to achieve this is relatively complex compared to the relatively simplified corresponding mechanism described in the present application in which the lead frame is provided with somewhat hinge-like members integral with the frame adjacent opposite ends of the connecting strips for the leads.

By using essential differences in the lead frames per se over those described and claimed in said co-pending application, it is possible to employ more simplified apparatus to achieve the desired results of mounting semi-conductor devices in headed ends of leads than the apparatus required to accommodate and handle lead frames of the type comprising the subject of said co-pending application.

The lead frame units operated upon by the mechanisms of both the co-pending and present applications are quite thin and, for only an example, may be within the range of between 0.006" and 0.010" thick. The semi-conductor devices received by and finally affixed to the leads of the lead frames also may be of the range, for only an example, of between ¼ inch and 1½ inches square, or a commensurate geometric configuration. Further, as another distinction between the invention of the present application and that of said co-pending application, twisting metal, such as the connecting strips employed in said co-pending application actually distorts and stretches portions of the strip, whereas simply bending the metal, especially of the thickness referred to in this application, does not distort it and, when reversely bent to flat condition, no discernable stretching occurs.

Referring particularly to FIGS. 1-3, there is shown therein an exemplary individual lead frame 10, which is illustrated with fragmentary ends respectively connected to additional lead frame units of the type illustrated. The lead frame preferably is formed from relatively thin sheet copper of conventional type used for lead frames. There is a central opening 12 in the frame. Four similar rows of multiple leads 14, each provided with split heads 16, which are nearest the opening 12, are integrally connected by longitudinal connecting strips 18. Extending angularly into corners of the lead frame between the various rows of leads are cutout notches 20, which intersect the bending axes 22, shown in dot-and-dash lines in FIG. 2. By means of the cutout notches 20 intersecting the ends of the connecting strips which are integral with the lead frame, it will be seen that portions 24 of the lead frame, illustrated by stippling in FIG. 2, comprise bendable hinge members which, are relatively short, are formed and comprise an essential part of the present invention.

Referring to FIG. 2, there is outlined by phantom line, clamping configurations 26, which have portions coinciding with the bending axes 22 of the connecting strips 18 and, as described in detail hereinafter, when bending members are projected against the hinge members 24, will bend the same along the axes 22, and thereby move the entire rows of leads 14 to an angular position, such as illustrated in phantom in exemplary manner in FIG. 3, which is a view taken on the line 3—3 of FIG. 2. It will be understood, of course, that there is a clamping configuration 26 at each corner of the lead frame and these are described in greater detail hereinafter, together with details of supporting members which cooperate with the clamping configurations 26, one example of such supporting member being shown in FIG. 7. Although in FIG. 1, a lead frame unit is shown in which two pairs of rows of leads, respectively at right angles to each other are illustrated and define a square central opening 12, it is to be understood, for example, that only a single parallel pair of rows of lead frames may be employed, if desired.

Figure 5:
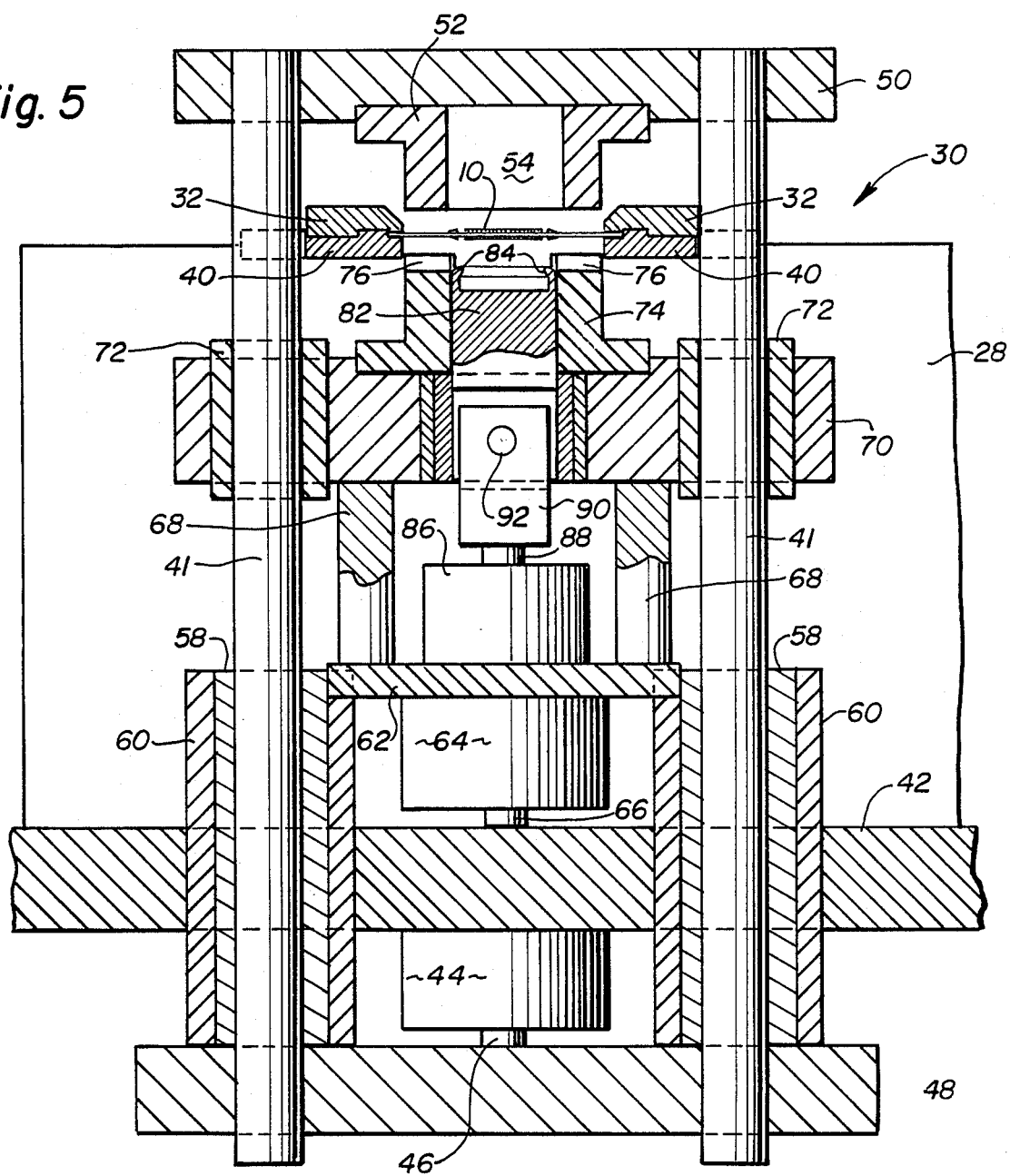
FIG. 5 is a vertical sectional view of the first station shown in FIG. 4, as seen on the line 5—5 of FIG. 4.

Referring to FIG. 4, there is illustrated therein a base frame 28 upon which is mounted a first or lead bending station 30, details of which are shown in FIG. 5 in vertical sectional manner. The frame 28 is provided with guide means 32 which are spaced opposite each other and extend longitudinally of the frame 20 and along which the strip 34 of lead frames 10 are moved, stepwise, by suitable means, not shown, for purposes of individually placing the lead frames in station 30 where the rows of leads are bent from the plane of the frame to an exemplary angular position similar to that shown in phantom in FIG. 3. Bending occurs by details shown in FIG. 5 and described hereinafter. After the rows of leads have been bent, they pass to a second station 36 where individual semi-conductor devices 38 are delivered along guide members 40 respectively to each of the advancing lead frames 10 and at station 36, the devices 38 are disposed upon the opposite rows of lower legs 80 of the heads of the leads and are incorporated therein, as described in detail hereinafter.

Referring to FIG. 5, wherein the first or lead bending station 30 is illustrated, it will be seen that the main frame 28 is located therein and is provided with a number of movable elements which are either individually connected to or are slidably movable upon a pair of parallel guide members 41. Frame 28 includes a lower horizontal member 42 which is fixed thereto and supports an operating member comprising a first fluid-operated cylinder 44. Said cylinder has a plunger 46 which is fastened to cross-bar 48 to which the lower ends of the guide members 41 are affixed. At the upper ends of guide members 41, a transverse head 50 is affixed and supports a clamping member 52, which has a central opening 54, and the lower face of the clamping member 52 includes at corners thereof, clamping configurations 26, which are shown in enlarged manner in FIG. 2, in phantom.

Still referring to FIG. 5, the lower portions of the guide members 41 are surrounded by cylindrical bushings 58 which, in turn, are surrounded by cylindrical sleeves 60, the upper ends of which are connected by a cross member 62 to which a second operating member, preferably in the form of another fluid-operated cylinder 64 is affixed, which has a plunger 66 attached thereto which abuts against the fixed frame member 42, as clearly shown in FIG. 5. Extending upward from cross member 62 and affixed thereto at one end are a pair of posts 68, the upper ends of which are affixed to a transverse cross-head 70, which includes cylindrical bearings 72 that also are slidable on the guide members 41. Fixed to the upper surface of cross-head 70 is a supporting member 74, the upper surface of which is as illustrated in FIG. 7, and in which it will be seen that clearance notches 76 are formed.

As the lead frames 10 are sequentially moved to the central position of the first station which is shown in FIG. 5, cylinder 64 is actuated to elevate the upper face of the supporting member 74 into contact with the lead frame 10 to support the same from below. Either simultaneously therewith or immediately subsequently, cylinder 44 is actuated to move the clamping member 52 against the so-called corner portions of the lead frame 10, as visualized in the phantom illustrations of the clamping configurations 26, shown in FIG. 2, thereby securely clamping those portions of the lead frame which are adjacent bendable hinge members 24 but members 24 are not engaged by the clamping faces or configuration 26.

Figure 9:
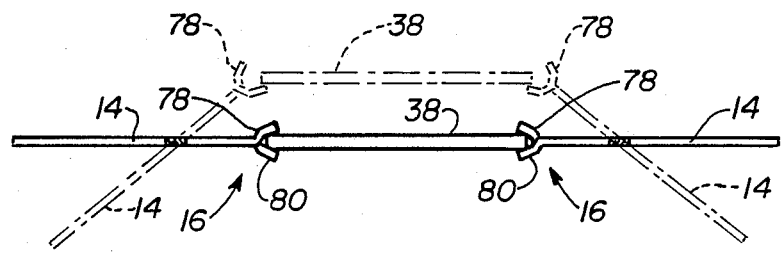
FIG. 9 is a side elevation showing exemplary opposed leads in full lines in flat condition within the plane of the lead frame and, in phantom, showing the leads disposed angularly to the plane of the lead frame and thereby in position to receive a semi-conductor device between the extended heads of the leads.
Figures 6, 7, 8:
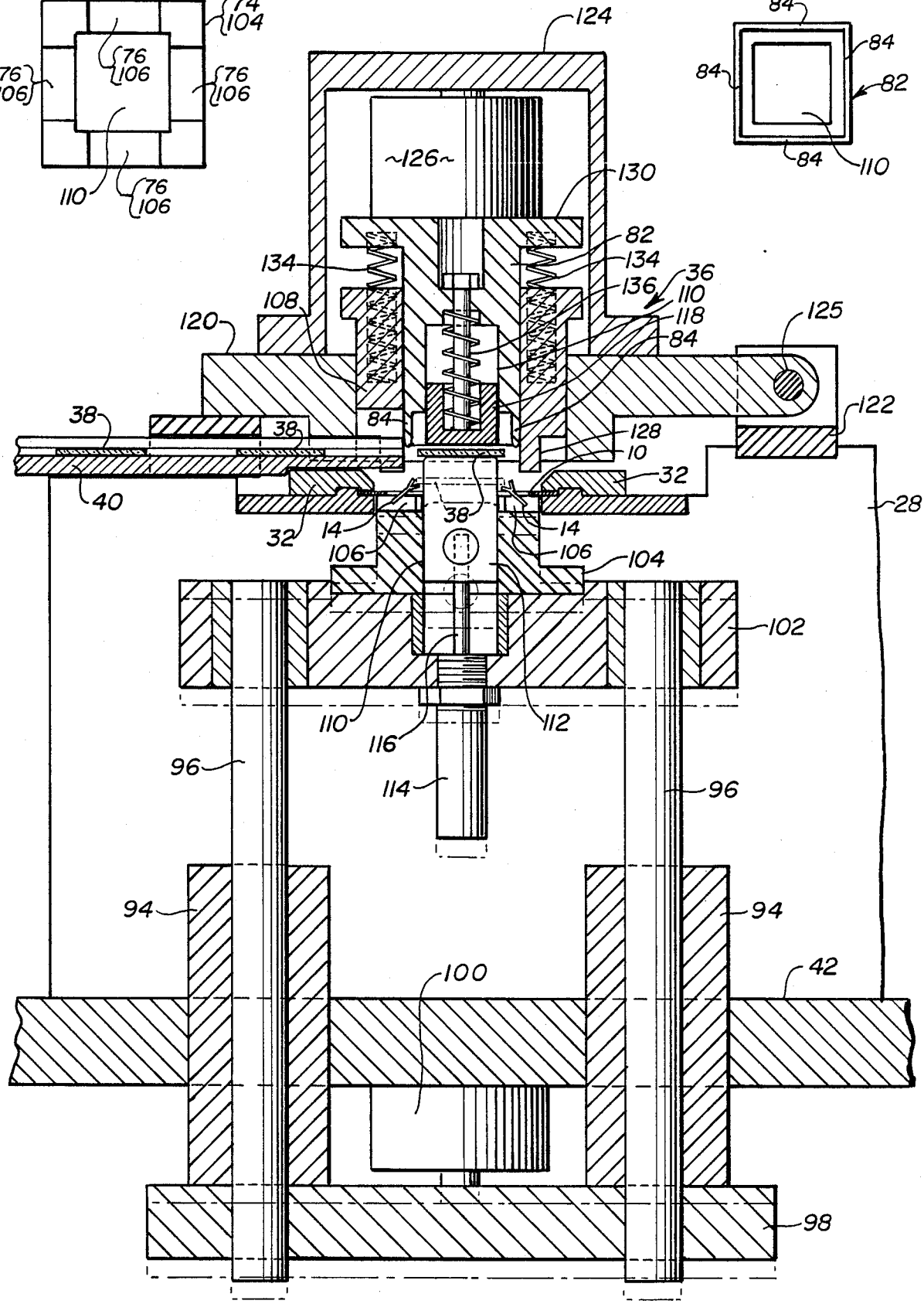
FIG. 6 is a vertical sectional view of the second station shown in FIG. 4, as seen on the line 6—6 of FIG. 4.
FIG. 7 is a bottom plan view of support members employed at both the first and second stations of operation and illustrating clearance notches to accommodate the ends of the angularly disposed leads which are opposite the headed ends.
FIG. 8 is a plan view of the composite bending members employed at the first and second stations to bend the hinge members at opposite ends of the connecting strips respectively to effect disposing the leads at an angle to the plane of the lead frame and restore the same to said plane.

In addition to clamping said so-called corner portions of the lead frame by the mechanism shown in FIG. 5, the purpose of the first station 30 is to dispose the rows of leads at an angle to the plane of the lead frame and in which the leads in the opposite rows thereof are all at an angle to the plane of the lead frame as shown in FIG. 6, and also as individually illustrated in FIG. 9. The purpose of so disposing the leads and especially the headed ends thereof at an angle to the plane of the lead frame is to space apart the uppermost legs of the heads a greater distance than the transverse dimension of the semiconductor device 38 which is to be placed upon the lower legs of said heads as can be visualized especially from FIG. 6, but more particularly from FIG. 9, wherein it will be seen in full lines, the leads 14 are shown within the plane of the frame, whereas, in phantom, the same are shown angularly disposed with respect to the plane of the frame. Also, the upper legs 78 in opposite rows are spaced apart at the outer ends a greater distance than the transverse dimension of the device 38 to be received therebetween. In phantom, it will be seen that when the leads are disposed at an angle to the plane of the frame, the upper legs 78 are spaced apart in the opposite rows thereof, a distance greater than the transverse dimension of the device 38 which then can be placed between the upper legs 78 but will be received upon the lower legs 80 which always are spaced apart a lesser distance than the transverse dimension of the device 38 to be received thereupon.

In FIG. 5, it will be seen that the supporting member 74 has a central opening which, for purposes of simultaneously bending the hinge members 24 at opposite ends of the connecting strips 18 simultaneously accommodates a bending member 82 which, in view of the exemplary lead frame being arranged with the headed ends of the rows of leads in a square configuration, also is square and is provided at the upper ends thereof with straight narrow bending elements 84, as shown in plan view in FIG. 8.

Bending member 82 is slidable within the complementary central opening of supporting member 74 by means of still another operating member, preferably in the form of a fluid-operated cylinder 86, provided with an operating plunger 88 that is connected to a head 90 which extends into the lower portion of bending member 82 and is connected thereto by a pin 92. In operating the bending member 82, when the supporting member 74 has engaged the lower surface of the lead frame 10 and clamping member 52 has descended thereupon to rigidly clamp especially the corner portion of the lead frame, cylinder 86 is activated and moves the straight, narrow bending elements 84 upwardly against the bendable hinge members 24, clearly shown by stippling in FIG. 2, and the upward movement of the bending members effectively bends the hinge members 24 on the bending axes 22, and thus disposes the opposite rows of leads at the exemplary angles, as illustrated in FIG. 9 and in which the upper legs 78 of the opposite rows of heads are spaced apart a distance at least slightly greater than the transverse dimension of the semiconductor device 38 to be passed therebetween to rest upon the lower legs 80 of the opposite rows of heads. Such placing of the devices upon the heads of the leads occurs at the second station shown in FIG. 6 and to which position the lead frames with the angularly disposed leads thereon are moved from first station 30 to second station 36, the operation of which is as follows:

Base frame 28 continues between the two stations 30 and 36 and in the portion 28 thereof at station 36, a pair of bearing sleeves 94 are affixed to horizontal frame member 42 for support thereby. Extending through the bearing sleeves 94 are vertical guide rods or members 96, which, on the lower ends thereof, are affixed to a transverse header 98, which is movable between the full line and phantom line position thereof by a fluid-operated cylinder 100, which is fixed to frame member 28. The upper ends of the guide rods 96 are affixed to a transverse support header 102 which, on the upper face thereof, fixedly carries a support member 104 which is similar to the support member 74 of first station 30. As in regard to the support member 74 of first station 30, support member 104, in FIG. 6, is provided in the upper surface thereof with clearance notches 106 which are provided for purposes of supplying spaces to accommodate the end of the leads 14 which are opposite the headed ends thereof, as is clearly shown in FIG. 1. In FIG. 6, the leads 14 are shown in angular relationship with respect to the lead frame 10 as a result of the operation upon the leads in the first station 30, as described above. In order that the strip of leads 10 which have had the leads disposed at an angle thereon may move from first station 30 to second station 36, it is necessary that the support header 102 be moved downwardly on frame 28 to the phantom position thereof, shown in FIG. 6, by operation of the fluid-operated cylinder 100, as described above. After a lead frame unit 10 has moved into operative position in second station 36, as shown in FIG. 6, cylinder 100 is operated to move the header 102 into full line position in which it is in engagement with the lead frame 10 for support incident to having a semiconductor device 38 positioned upon the heads of the leads 14 of the lead frame 10.

The semi-conductor devices 38 are fed by means, not shown, sequentially to a position vertically above the lead frame 10 which is to receive the same, as shown in FIG. 6. As in regard to the supporting and clamping mechanism in first station 30, support member 104 and clamping member 108 are provided with aligned central openings 110, as shown, for example, in FIGS. 6-8, and these are also alignable with the central opening 12 in lead frame unit 10. Extending upward through the central opening 110 of support member 104 in FIG. 6 is an anvil member 112, which is projected upwardly through opening 110 in member 104 by power supplied by another fluid-operated cylinder 114 provided with a piston rod 116, the upper end of which is connected to anvil member 112. In the controlled operation of the various fluid-operated cylinders of conventional type, not shown, when a semiconductor device 38 is disposed in position directly above the receiving lead frame 10, it is supported upon the upper face of anvil member 112 for purposes of being lowered for reception between the upper legs of the heads of the leads 14 shown in FIG. 6

The device 38, shown in position upon anvil member 112, in FIG. 6, now must be lowered to the receiving heads of the lead frame 10 and this is accomplished by a plunger 118, which is lowered and operated by mechanism shown in the upper portion of FIG. 6 and includes a normally horizontal base member 120, one end of which is pivoted to a bracket 122 affixed to base frame 28 and includes a pivot pin 125, shown in FIG. 6. This arrangement is for purposes of permitting base member 120 to be raised to give access to the mechanism below the same in the event of malfunction or otherwise.

Affixed to the upper surface of base member 120 is a housing 124 in which is provided a fluid-operated cylinder 126 which has an operating plunger extending from the upper portion of the cylinder and affixed to the interior of the top wall of housing 124, as clearly shown in FIG. 6, in order that the cylinder 126 may depress clamping member 128, the lower end of which is similar to the clamping member 52 in first station 30 and is adapted to be lowered against the lead frame 10 supported by support member 104. In FIG. 6, the clamping member 128 is shown in elevated position.

A head member 130 is fixed to the lower end of fluid-operated cylinder 126 and integrally depending therefrom is presser head 82 which, in the interior thereof has a space complementary to the plunger 118 to slidably receive the same. For purposes of simplicity, the presser head 82 in FIG. 6, which illustrates the second station, and the narrow bending members 84 thereon have the same reference numerals as in FIGS. 4, 5 and 8. The plurality of springs 134 exert pressure from head member 130 against clamping member 128 and while this occurs, the head member 130 is descending to lower plunger 118 against the device 38 disposed on anvil member 112 by means of another spring 136 which directly exerts pressure upon the plunger 118 which abuts the device 38 in a manner not to affect the circuitry thereon and the downward movement of the plunger 118 against the device 38 effects lowering of the anvil member 112 by automatically controlled bleeding of the fluid in cylinder 114 to permit lowering of the anvil member 112 to dispose the device 38 to the phantom position shown in FIG. 6 with respect to the head members of the leads 14.

The lower face of presser head 82 terminates in thin bending members 84, having a configuration similar to that shown in FIG. 8, which also corresponds to the narrow bending elements 84 of the first unit 30, shown in FIG. 5. After the device 38 has been positioned in the phantom position of FIG. 6, presser head 82 descends in a manner to engage the lower ends of the bending members 84 against the projecting hinge members 24 and decreases the same to restore the leads 14 to the plane of the lead frame 10, such as illustrated diagrammatically in FIG. 9, and thereby connects the device 38 to the heads of the leads 14 in such manner that said heads then may be connected, such as by solder paste to the semi-conductor device 38. Such lowering of the heads of the leads with the device 38 therebetween occurs while the plunger 118 is still in engagement with the device 38 as the anvil member 112 continues to descend by bleeding of the fluid from the cylinder 114.

Figure 10:
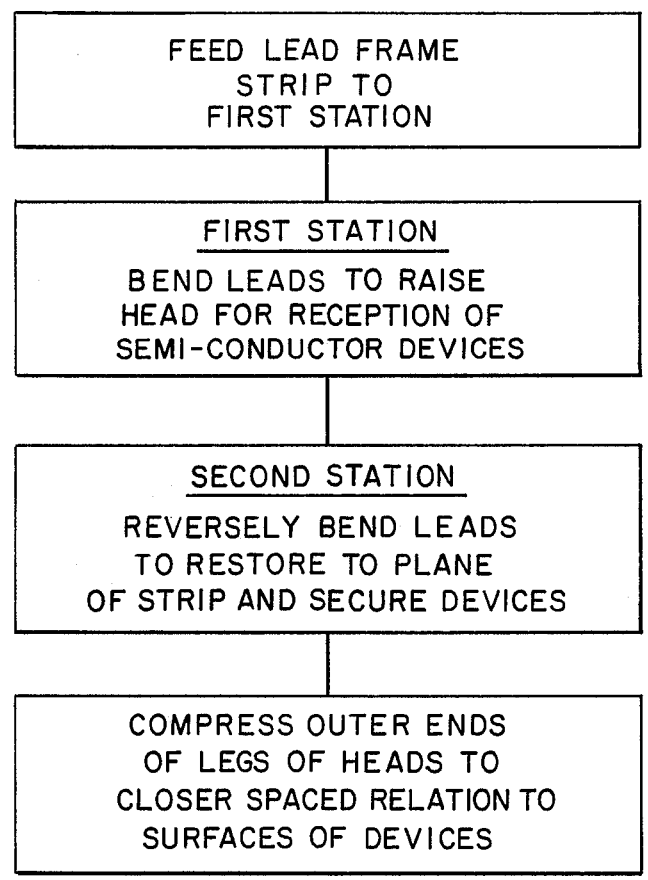
FIG. 10 is a diagrammatic flow chart of applicant's method.

As a final step in the operation of the device, and as can be seen from FIGS. 3 and 9, the legs 78 and 80 of the heads 16 of leads 14 extend at a substantial angle to each other and for purposes of soldering the legs to the terminals on the edges of the device 38, it is preferred that only a very small space, such as of the order of between 0.002" and 0.004", exist between the legs and the adjacent terminals of the device 38, by depressing said ends of legs as set forth in FIG. 10.

From the foregoing, it will be seen that the present invention provides a compact mechanism to perform the method described above of affixing semi-conductor devices 38 to lead frames 10, the mechanism being operated primarily by fluid-operated cylinders, the function of which is controlled by conventional means arranged for automatic operation, in sequence, as the various movements of the elements of the mechanism are required. Due to using the bendable hinge members 24 at the opposite ends of the connecting strips 18, no distortion of any consequence is subjected to the metal. Also, the bending of hinge members 24 occurs relative edges of the clamping and/or support members 52 and 74 as engaged by the narrow bending elements 84, which are simple and operate against the bendable members which are portions of the lead frame that project in the central spaces of the frames, as well as the aligned central openings in the support and clamping members and in which openings the narrow bending members slidably operate against the projecting hinge members exposed in said openings.

The foregoing description illustrates preferred embodiments of the invention. However, concepts employed may, based upon such description, be employed in other embodiments without departing from the scope of the invention. Accordingly, the following claims are intended to protect the invention broadly, as well as in the specific forms shown herein.

I claim:

1. A method of mounting geometric semiconductor devices respectively upon similar lead frame units connected to each other in strip form and each unit having at least an opposed pair of rows of similar leads on opposite sides of a central opening in each frame unit, said leads having on one end heads comprising a pair of similar legs evenly bent into fork-like configurations and the distance between the ends of said legs on said opposite rows thereof being less than the transverse dimension of said semi-conductor devices to be supported between said rows of heads, said rows of leads being connected integrally intermediately of the ends thereof by an elongated connecting strip, the ends of said strip are connected to portions of said lead frame by bendable portions of said lead frame adjacent opposite ends of said connecting strip, said method comprising the steps of:
   a. positioning a unit of said lead frame upon a supporting plate of a forming mechanism which plate has flat clamping areas and an opening alignable with the central opening in said units,
   b. moving a pressure plate provided with a flat clamping surface and a similar central opening into firm clamping position against said unit disposed upon said supporting plate with the openings thereof in alignment to form bending axes along the aligned edges of said openings and the headed ends of said leads projecting beyond said aligned edges and into the aligned openings of said plates,
   c. moving a pair of parallel narrow bending members into said aligned openings respectively adjacent the rows of headed leads projecting beyond the portions of said lead frames which are clamped between said members and bending said bendable portions of said frame in common direction uniformly through an angle of sufficient degree to the plane of said lead frame to form angularly disposed bendable portions and thereby space apart the ends of the upper legs of the opposite rows of heads a distance greater than the transverse dimension of said semi-conductor device,
   d. depositing a semi-conductor device through said aligned openings in said plates and resting it upon the opposite legs of the opposed rows of heads,
   e. withdrawing said bending members from engagement with said bendable portions of said frame,
   f. moving additional narrow bending members into engagement with the surfaces of said angularly disposed bedable portions of said frame opposite those engaged by said first-mentioned bending members to reversely bend said portions and restore the leads and heads thereon to the plane of the lead frame and thereby cause the ends of said upper legs of said heads to overlie the edges of said device and thereby secure it to said lead frame unit while adjacent portions of said lead frame remain clamped, and
   g. releasing said frame units from said clamping means for further processing to complete said units.

2. The method according to claim 1 further characterized by said first-mentioned bending members moving in bending direction sufficiently to dispose said headed leads at an angle of 40° from the plane of said lead frame.

3. The method according to claim 1 in which said forming mechanism further includes an anvil and including the further steps of positioning said anvil within the openings in said supporting and pressure plates substantially at a level with the lower legs of the heads which receive and support the semi-conductor device, and as said leads and heads are restored to the plane of said lead frame, moving said anvil simultaneously with said heads to support said device while the edges thereof are being respectively overlaid by the legs of said heads.

4. The method according to claim 3 including the further step of engaging with pressure means the ends of the legs of said heads which overlie the edges of said semi-conductor device and pressing said ends of the legs into more closely spaced relation to the surfaces of said device to allow soldering of the legs of the head to the terminals on the edges of the device.

5. The method according to claim 4 including the further step of moving a supporting anvil axially in said openings in said plates in a direction and at a speed adequate to support the semi-conductor devices within the rows of heads when the bent leads are being restored to the plane of said lead strip units.

6. The method according to claim 4 including the further and final step of compressing the outer ends of the legs of said heads toward each other until the spaces between said ends and the opposite edge surfaces of said semi-conductor device are of a range between 0.002" and 0.004".

7. The method according to claim 1 in which said forming mechanism comprises means to feed a strip of said lead frame units stepwise in advancing direction to a first bending station where portions of the ends of said connecting strips of the leads and/or adjacent portions of said frame are clamped firmly between plates and the leads are bent along an axis at an angle to permit the heads to receive a semi-conductor device, a second station where semi-conductor devices are delivered to and positioned upon said frame units, and where said headed leads are restored to the plane of said lead frame, said method including the further steps at said stations of successively moving said strip of lead frame units to said first station to bend said frame portions at an angle to the plane of said frames, then depositing at the second station a semi-conductor device upon the heads of said leads, followed by reversely bending the frame portions in an opposite direction to restore the leads to the plane of the lead frame with a device secured in each frame unit, and lastly, separating said plates and passing the lead frame units with devices mounted therein from the forming mechanism.

8. Forming mechanism operable to position uniform semi-conductor devices successively with central openings in lead frame units fed stepwise to said mechanism and said units having at least one pair of parallel rows of headed leads respectively on opposite sides of said central opening therein, said leads also being connected integrally intermediately of the ends thereof to an elongated connecting strip and the opposite ends of said strip being integral with said lead frame units, said mechanism comprising respective generally similar supporting and clamping members having central openings similar to that of said lead frame units and alignable with said central opening of said lead frame unit, said supporting and clamping members having transversely spaced surfaces engageable respectively with opposite surfaces of the portions of said lead frame units which are adjacent the corners of said central opening therein, the headed ends of said leads of said lead frame units and at least portions of said connecting strips extending into the aligned central openings of said supporting and clamping members, and similar elongated narrow bending members movable axially within said aligned central openings of each of said supporting and clamping members when clamping a frame unit therebetween and engaging the portions of said lead frame units which are immediately adjacent the opposite ends of said connecting strips and which also extend into said openings for engagement by said bending members initially to bend said portions of said frame through a limited angle about edges of the opening of said clamping member to extend the headed ends of said leads upwardly within said openings in position to receive a semi-conductor device, and subsequently engage said bent portions of said frame which are adjacent said opposite ends of said connecting strips with a second of said bending members to restore the headed ends of the leads to the plane of said frame and thereby secure said device between the heads of opposite rows thereof.

9. The forming mechanism according to claim 8 further characterized by said mechanism also comprising two operating stations, respectively a loading station o place a semi-conductor in each lead frame and a second station in which the headed leads of the lead frames are secured to the devices, said loading station being operable to lead a semi-conductor device into each successive lead frame and including a guideway along which a strip of connected lead frame units are fed stepwise to said supporting and clamping members for operation thereon by said bending members operable axially within said aligned openings in said supporting and clamping members and engaging said portions of the frame which are adjacent opposite ends of said connecting strips to bend the same against the edges of the opening in said clamping member and thereby elevate the heads of said leads above the plane of said frame to position said heads to receive a device upon the lower legs of each head, and said second station having guide means to deliver semi-conductor devices respectively to the central opening of each lead frame and dispose the same upon the lower legs of the elevated heads of said frame, said station also including said elongated bending members operable axially downward within the aligned openings of said supporting and clamping members to engage said bent portions of said frame and move the same about edges of the opening in said supporting member to restore said portions of the frame and the elevated heads to the plane of said frame and thereby dispose the upper legs of said heads in overlying relation to the edges of said device to secure the same to said frame.

10. The forming mechanism in accordance with claim 9 further characterized by said elongated narrow bending members of said leading and second stations being arranged in a substantially square configuration and are slidably movable with in the central openings of said supporting and clamping members and operable to bend said frame portions adjacent said opposite ends of said connecting strips of said lead frame units having two pairs of opposite rows of leads respectively at a right angle to each other, said square arrangement of bending members being movable slidably and closely adjacent the bending edges of the square openings respectively in said clamping and support members to effect said bending of said aforementioned portions of said frame members.

11. The forming mechanism according to claim 8 further including a plurality of independently controlled fluid-actuated power units arranged in vertical alignment in each of said stations and connected to said clamping and bending members at said stations and operable in reverse directions at said stations respectively to effect bending said bendable portions of said frame adjacent opposite ends of said connecting strips to elevate the heads of said leads and then returning said bendable portions to a starting position.

12. The forming mechanism according to claim 11 further including at said second station a head supported above said clamping member in vertical alignment with the opening therein and having an additional fluid-actuated power unit connected thereto and operable to move said head against a semi-conductor device when positioned upon the heads of a lead frame to maintain said device thereon while said bending members are moving downward against said upwardly-bent headed leads to return the bent portions of said lead frame adjacent opposite ends of said connecting strips to the plane of the lead frame.

13. The forming mechanism according to claim 8 further including a stationary base comprising a support for said first and second stations and said first station further comprising a horizontal guideway mounted upon said base and adapted to receive and slidably support a strip of said lead frames, guide means in said base perpendicular to the plane of said guideway and longitudinally movable in said base by power means in said base, said supporting member being movable upon said guide means upwardly from a rest position to a supporting position in the plane of said guideway by power means in said base, said supporting member having surfaces arranged to receive corner portions of said lead frame units and recesses between said surfaces to accommodate unheaded portions of said leads when disposed in device-receiving position, said clamping member being supported above said guideway and connected to said movable guide means adjacent the upper ends thereof and movable from an upper rest position downwardly into clamping position in opposition to said supporting member, and said bending members comprising a square configuration of straight bending edges supported by a member slidable upon said guide means and powered by means connected to said base, said bending members being movable upwardly through the central opening of said supporting member into engagement with the portions of said frame unit adjacent opposite ends of said connecting strips and operable to bend the same about the edges of the central openings in said clamping member to position the heads of said leads suitably to receive a semi-conductor unit for support upon the lower legs of said heads.

14. The forming mechanism according to claim 8 further including at said second station a stationary base having a first guide means along which a strip of said lead frame is guided and supported, means operable to feed said strip stepwise along said guide means, a frame supported upon said base above said guide means and provided with a second guide means extending transversely to said first guide means and above the latter, said supporting member being movably supported relative to said base for movement perpendicularly to said first guide means by power means in said base and thereby position said supporting member in the plane of said first guide means to support said lead frame from below, said clamping member being supported by said frame for movement perpendicularly downward toward and to said supporting member to clamp the corners of said lead frame against said supporting member, and said square bending member being supported for downward movement from an elevated rest position to engage said bendable portions of said frame and bend the same to restore the headed leads of said lead frame unit to the plane of said frame with the semi-conductor device positioned thereon and thereby secure said device between the opposite rows of heads on said leads.

* * * * *